US006448811B1

(12) United States Patent
Narendra et al.

(10) Patent No.: US 6,448,811 B1
(45) Date of Patent: Sep. 10, 2002

(54) INTEGRATED CIRCUIT CURRENT REFERENCE

(75) Inventors: Siva G. Narendra, Portland; Amaresh Pangal, Hillsboro; Stephen R. Mooney, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/824,370

(22) Filed: Apr. 2, 2001

(51) Int. Cl.[7] .............................................. H03K 17/16
(52) U.S. Cl. .............................. 326/82; 326/27; 326/30
(58) Field of Search .............................. 326/26, 27, 30, 326/31, 83, 86, 87

(56) References Cited

U.S. PATENT DOCUMENTS

| | | | |
|---|---|---|---|
| 4,475,077 A | 10/1984 | Nagano | 323/312 |
| 4,573,168 A | 2/1986 | Henze et al. | 375/36 |
| 4,624,006 A | 11/1986 | Rempfer et al. | 377/69 |
| 4,967,140 A | 10/1990 | Groeneveld et al. | 323/315 |
| 5,218,239 A * | 6/1993 | Boomer | 326/83 |
| 5,253,249 A | 10/1993 | Fitzgerald et al. | 370/24 |
| 5,457,406 A | 10/1995 | Takada et al. | 326/30 |
| 5,481,207 A | 1/1996 | Crafts | 326/86 |
| 5,490,171 A | 2/1996 | Epley et al. | 375/257 |
| 5,530,377 A | 6/1996 | Walls | 326/30 |
| 5,604,450 A | 2/1997 | Borkar et al. | 326/82 |
| 5,783,936 A | 7/1998 | Girard et al. | 323/315 |
| 5,793,248 A * | 8/1998 | Lee et al. | 326/87 |
| 5,841,827 A * | 11/1998 | Chevallier | 327/175 |
| 6,037,811 A * | 3/2000 | Ozguc | 326/87 |
| 6,087,847 A | 7/2000 | Mooney et al. | 326/30 |
| 6,087,853 A | 7/2000 | Huber et al. | 326/83 |
| 6,118,310 A | 9/2000 | Esch, Jr. | 327/108 |
| 6,121,764 A | 9/2000 | Stockstad | 323/315 |
| 6,133,749 A * | 10/2000 | Hansen et al. | 326/87 |
| 6,150,806 A | 11/2000 | Canard et al. | 323/315 |
| 6,157,206 A | 12/2000 | Taylor et al. | 326/30 |
| 6,188,237 B1 * | 2/2001 | Suzuki et al. | 326/86 |

OTHER PUBLICATIONS

Comer, D.T., et al., "A CMOS Voltage to Current Converter For Low Voltage Applications", This information is directly fron Donald T. Comer's web site. http://www.ee.byu.edu/faculty/comerdt/publications.html, 13 p., (Feb. 11, 1997).

Filanovsky, I.M., "Voltage Reference Using Mutual Compensation of Mobility and Threshold Voltage Temperature Effects", *ISCAS 2000—IEEE International Symposium on Circuits and Systems*, pp. V197–V200, (May 2000).

Haycock, M., et al., "A 2.5Gb/s Bidirectional Signaling Technology", *Hot Interconnects Symposium V*, pp. 1–8, (Aug. 1997).

Lee, S., et al., "A Temperature and Supply–Voltage Insensitive CMOS Current Reference", *IEICE Trans. Electron*, vol. E82–C, pp. 1562–1566, (Aug. 1999).

* cited by examiner

*Primary Examiner*—Don Phu Le
(74) *Attorney, Agent, or Firm*—Schwegman, Lundberg, Woessner & Kluth, P.A.

(57) ABSTRACT

A current reference with reduced sensitivity to process variations includes a variable resistor and a control transistor. The control transistor has a generated current from source-to-drain that first passes through the variable resistor. The control transistor has a reference voltage applied to the gate, and the source-to-gate voltage is a function of the reference voltage and the voltage drop across the variable resistor. A control loop circuit measures the generated current and modifies the resistance value of the variable resistor in response. An external precision resistor is used to measure the generated current, and current variations as a result of process variations are reduced.

22 Claims, 3 Drawing Sheets

US 6,448,811 B1

INTEGRATED CIRCUIT CURRENT REFERENCE

FIELD

The present invention relates generally to current references, and more specifically to current references that provide substantially constant current.

BACKGROUND

Current references are circuits that are designed to provide constant current. The constant current is utilized in other circuits, and the design of these other circuits typically relies on the current being constant. One problem with current references is that the current provided can be sensitive to voltage, temperature, and process variations. That is to say, as the voltage, temperature, or process parameters (such as transistor threshold voltages) vary, the current generated by the current reference also varies.

Sensitivity to temperature and power supply voltage variations in current references, and the reduction thereof, has been the subject of much study. See, for example, Sueng-Hoon Lee and Yong Jee, "A Temperature and Supply-Voltage Insensitive CMOS Current Reference," IEICE Trans. Electron., Vol.E82-C, No.8 August 1999.

Sensitivity to process variations has been historically handled by design margins. For example, if, over expected process variations, a current generated by a current reference can vary by a factor of two, the current reference is typically designed to have a nominal current equal to twice the minimum specified value so that under worst case conditions, the minimum current value is guaranteed to exist. Power is wasted as a result, in part because the nominal current value is twice what is needed.

For the reasons stated above, and for other reasons stated below which will become apparent to those skilled in the art upon reading and understanding the present specification, there is a need in the art for a current reference with reduced sensitivity to process variations.

DESCRIPTION OF EMBODIMENTS

Figure 1:
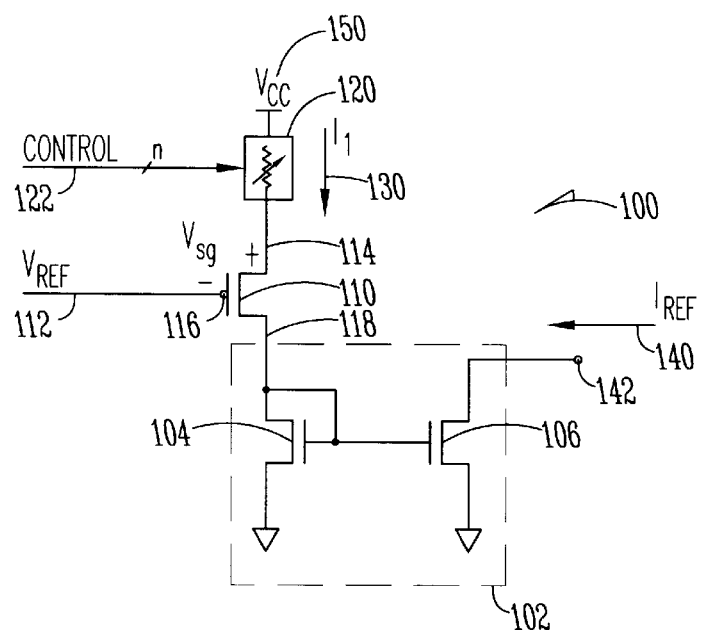
FIG. 1 shows a current reference with a variable resistor.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

The method and apparatus of the present invention provide a mechanism to reduce a current reference's sensitivity to process variations. A control transistor has a generated current from source-to-drain that first passes through a variable resistor. The control transistor has a reference voltage applied to the gate, and the source to gate voltage is a function of the reference voltage and the voltage drop across the variable resistor. A control loop circuit measures the generated current and modifies the resistance value of the variable resistor in response. An external precision resistor is used to measure the generated current, and current variations as a result of process variations are reduced.

FIG. 1 shows a current reference circuit. Current reference circuit 100 includes current mirror 102, control transistor 110, and variable resistor 120.

Variable resistor 120 is a variable resistor with a resistance value that changes responsive to signals on control input bus 122. A number "n" of control signals are represented in FIG. 1, however, any number of control signals can be utilized. The resistance value of resistor 120 is modified by changing signal values present on control input bus 122. Variable resistor 120 is coupled between upper power supply node 150 and control transistor 110. Example implementation embodiments of variable resistor 120 and the control of its resistance value are explained in more detail below with reference to figures that follow.

Control transistor 110 is a p-channel transistor with source 114, gate 116, and drain 118. Source 114 is coupled to upper power supply node 150 through variable resistor 120. Upper power supply node 150 is shown as $V_{cc}$ in FIG. 1. Gate 116 receives a reference voltage ($V_{REF}$) on node 112, and drain 118 is coupled to current mirror 102. In embodiments represented by FIG. 1, control transistor 110 is a p-channel metal oxide semiconductor field effect transistor (PMOSFET). In other embodiments, other types of transistors are used. For example, in some embodiments, junction field effect transistors (JFET) are used, and in other embodiments, bipolar junction transistors (BJT) are used. As used herein, the term "PFET" refers to any transistor having a p-doped channel. Control transistor 110 is an example of a PFET.

In some embodiments, control transistor 110 is a "long channel" device. A long channel device is one that has a channel from source-to-drain that is longer than the minimum dimension for the process in which it is manufactured. Using long channels can aid in avoiding process variations related to small lateral dimensions. Short channel devices can also be used. When short channel devices are used, circuit analysis can become more complicated in part because certain assumptions cannot be made.

Current mirror 102 includes diode-connected transistor 104 and second transistor 106 to produce current 140 ($I_{REF}$) on node 142, which, as shown in FIG. 1, is substantially equal to current 130 ($I_1$). Throughout this description, current 130 is also referred to as "$I_1$," or the "generated current." The term "diode-connected" as used herein, refers to a transistor that has a gate tied to a drain, such that the gate-to-source voltage and the drain-to-source voltage are equal. In other embodiments, diode-connected transistor 104 and second transistor 106 are sized such that currents 140 and 130 are related, but are not equal. Many embodiments of current mirror 102 exist. In some embodiments, current mirror 102 is implemented as a bipolar transistor current mirror. In other embodiments, current mirror 102 is implemented using junction field effect transistors (JFETs). In embodiments represented by FIG. 1, current mirror 102 is implemented using n-channel metal oxide semiconductor field effect transistors (NMOSFETs). Current mirror 102 can be implemented in many other ways without departing from the scope of the present invention.

The combination of control transistor 110 and variable resistor 120 set the value of current 130, which in turn sets the value of current 140 through the action of current mirror 102. The manner in which control transistor 110 and variable resistor 120 set the value of current 130 is now described.

When control transistor 110 is a long channel device operated in a saturation region, current 130 ($I_1$) is given by $$I_1 = \frac{\mu C_{ox} W}{2L}(V_{sg} - V_t)^2 \quad (1)$$

where $V_{sg}$ is the source-to-gate voltage, $V_t$ is the threshold voltage, $\mu$ is the mobility, $C_{ox}$ is the oxide capacitance, W is the width, and L is the length of control transistor 110. $V_t$, $\mu$, and $C_{ox}$ of the device vary over process variations. As these parameters vary as a function of process variations, the resulting transistors can be characterized as "fast" or "slow." When control transistor 110 is a "fast" device, current 130 is lower than when control transistor 110 is a "slow" device, for any given value of $V_{sg}$ applied to control transistor 110.

The method and apparatus of the present invention detect the change in control transistor 110 due to process variations and control the source-to-gate voltage ($V_{sg}$) in such a way that current 130 ($I_1$) remains substantially constant across process variations. In equation form, this is shown by $$I_1 = \frac{\mu C_{ox} W}{2L}(V_{cc} - I_1 R - V_{REF} - V_t)^2 \quad (2)$$

where R is the resistance value of variable resistor 120, and $V_{cc} - I_1 R - V_{REF}$ represents the source-to-gate voltage ($V_{sg}$). $V_{cc}$ is a substantially constant reference voltage provided by a power supply for current reference circuit 100. $V_{REF}$ is also substantially constant. The voltage $V_{REF}$ can be kept substantially constant using known methods. One known method is shown in I. M. Filanovsky, "Voltage Reference Using Mutual Compensation of Mobility and Threshold Voltage Temperature Effects," 197–200, ISCAS 2000, May 28–31, 2000, Geneva, Switzerland. Because R is variable, the source-to-gate voltage of control transistor 120 can be varied by varying R.

Various embodiments have been described with p-channel control transistors and current mirrors that include n-channel transistors. Other embodiments have n-channel control transistors and current mirrors that include p-channel transistors. In these embodiments, variable resistors are coupled between the control transistor and a lower power supply node.

Figure 2:
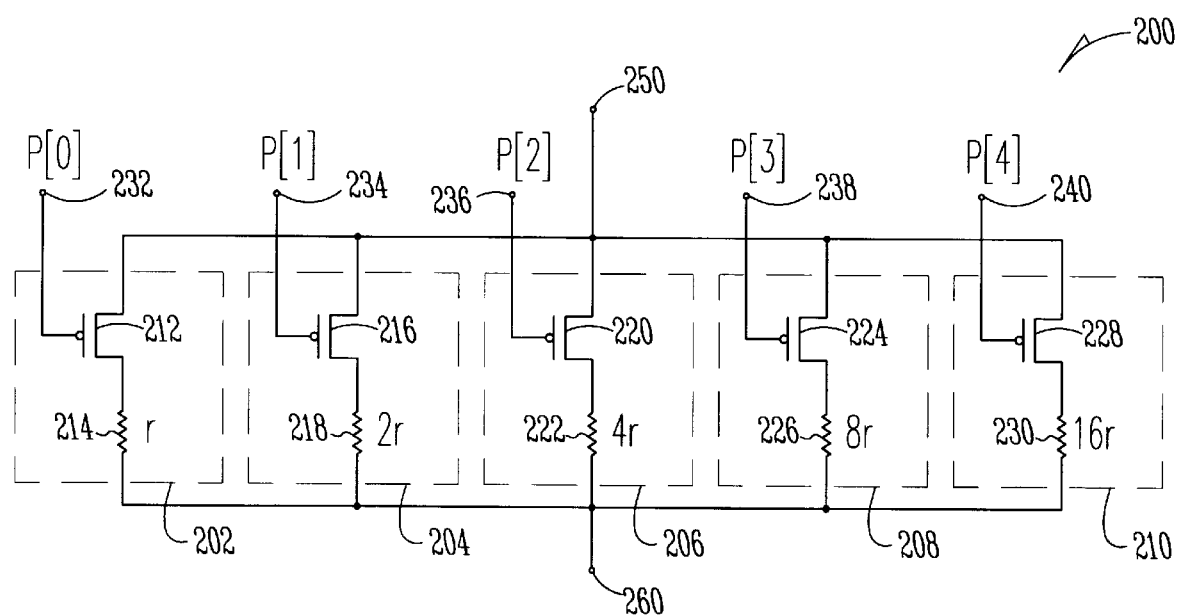
FIG. 2 shows a variable resistor.

FIG. 2 shows a variable resistor. Variable resistor 200 includes multiple resistive devices, each having a control input node. For example, variable resistor 200 includes resistive devices 202, 204, 206, 208, and 210. Each of the resistive devices includes a transistor and a fixed value resistor. For example, resistive device 202 includes PFET 212 and resistor 214. Likewise, resistive devices 204, 206, 208, and 210 include PFETs 216, 220, 224, and 228 and resistors 218, 222, 226, and 230, respectively.

Each resistive device is coupled in parallel between two reference nodes 250 and 260. Each resistive device includes a control input node having a signal that either turns on or turns off the PFET. For example, PFET 212 within resistive device 202 has a gate driven with the signal on control node 232. Likewise, control nodes 234, 236, 238, and 240 provide control signals to PFETs 216, 220, 224, and 228, respectively.

The resistors within the resistive devices can be any type of resistor fabricated on an integrated circuit. In some embodiments, resistors are fabricated as N-well resistors, as is known in the art. In the embodiment shown in FIG. 2, the resistive devices have binary weighted resistance values. For example, resistor 214 has a resistance value of "r," and resistor 214 has a resistance value of "2r." The resistance values double for each resistive device, and the largest resistance value of "16r" exists in resistance element 210.

Control input nodes 232, 234, 236, 238, and 240, taken together, form a control bus. In the embodiment of FIG. 2, this control bus is driven by a five bit wide signal labeled P[4:0]. The generation of this five bit wide signal is explained further with reference to later figures. By varying which control signals are asserted, 31 different resistance values can be obtained between nodes 250 and 260.

Variable resistor 200 utilizes p-channel transistors, and is useful to implement resistors with voltages closer to a positive voltage reference than to a negative voltage reference. For example, variable resistor 200 can be utilized for variable resistor 120 (FIG. 1). When variable resistor 200 is utilized for variable resistor 120, the five bit wide control bus of FIG. 2 corresponds to control input bus 122.

In other embodiments, variable resistor 200 utilizes n-channel transistors. These embodiments can be utilized for variable resistors with voltages closer to a negative voltage reference. For example, such a variable resistor can be useful when coupled between a control transistor and a negative voltage reference in a current reference with an n-channel control transistor.

Variable resistor 200 has been described with resistive devices, each including a resistor with a binary weighting relative to the other resistors. Any number of resistive devices can be included without departing from the scope of the present invention. Binary weighting can be maintained with a large number of resistive devices, or a linear weighting can be employed. For example, variable resistor 200 can be implemented with each resistive device including a resistor of equal value. This reduces the number of possible resistance values available, but also reduces the possibility of a transient resistance value appearing when signal values on the input bus change.

Figure 3:
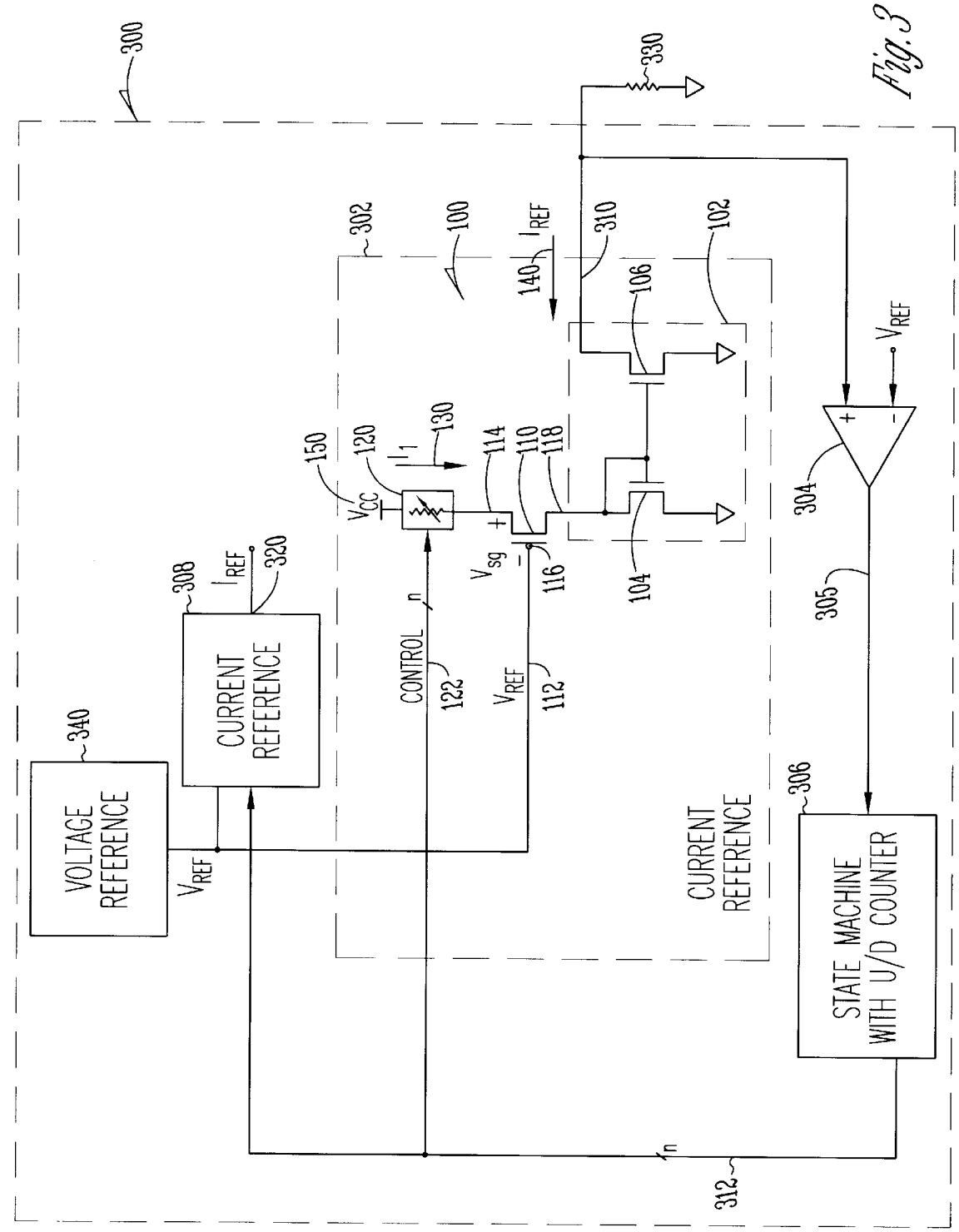
FIG. 3 shows an integrated circuit having a current reference and a control loop circuit.

FIG. 3 shows an integrated circuit having a current reference and a control loop circuit. Integrated circuit 300 includes two current references 302 and 308, voltage reference 340, voltage comparator 304, and state machine 306. Current reference 302 is shown as current reference 100 (FIG. 1) with voltage reference 340 being shared between current references 302 and 308. Variable resistor 120 within current reference 100 is driven by control signals generated by state machine 306 on node 312. Current reference 302, voltage comparator 304, and state machine 306 form a control loop circuit that modifies the resistance value of variable resistor 120. Also shown in FIG. 3 is resistor 330, which is external to integrated circuit 300. High precision resistors are readily available, and resistor 330 can be a high precision resistor selected for a particular application of integrated circuit 300.

Current source 302 generates an output current on node 310 as described with reference to the previous figures. This current travels through precision resistor 330 and generates a voltage. This voltage is compared against the reference voltage by voltage comparator 304. In some embodiments, voltage comparator 304 produces a digital output on node 305, which is input to state machine 306. In some embodiments, state machine 306 includes a counter that counts up or down depending on the value of the digital signal on node 305. As state machine 306 counts up or down, control signals on node 312 modify resistance values of variable resistors within current references 302 and 308. As a result of the change in resistance values, current reference 302 modifies the current on output node 310, and the loop is closed.

By utilizing variable resistors within current references 302 and 308, resistance values can be trimmed to match, or to be a function of, the resistance of an external precision resistor. When the control loop circuit is locked and the variable resistors internal to current reference 302 have stable resistance values, the output current on output node 310 satisfies equation (2), above, where "R" is the static value of variable resistor 120.

Integrated circuit 300 includes two current references 302 and 308. The output current from current reference 302 is utilized to close the control loop that generates control signals on node 312. Current reference 308 receives the control signals on node 312 and produces a current reference output current (shown as "$I_{REF}$" in FIG. 3) on node 320.

Any number of current references can utilize the control signals on node 612. One current reference, current reference 302, is used to close the control loop circuit, but many more current references can utilize control signals generated thereby.

Figure 4:
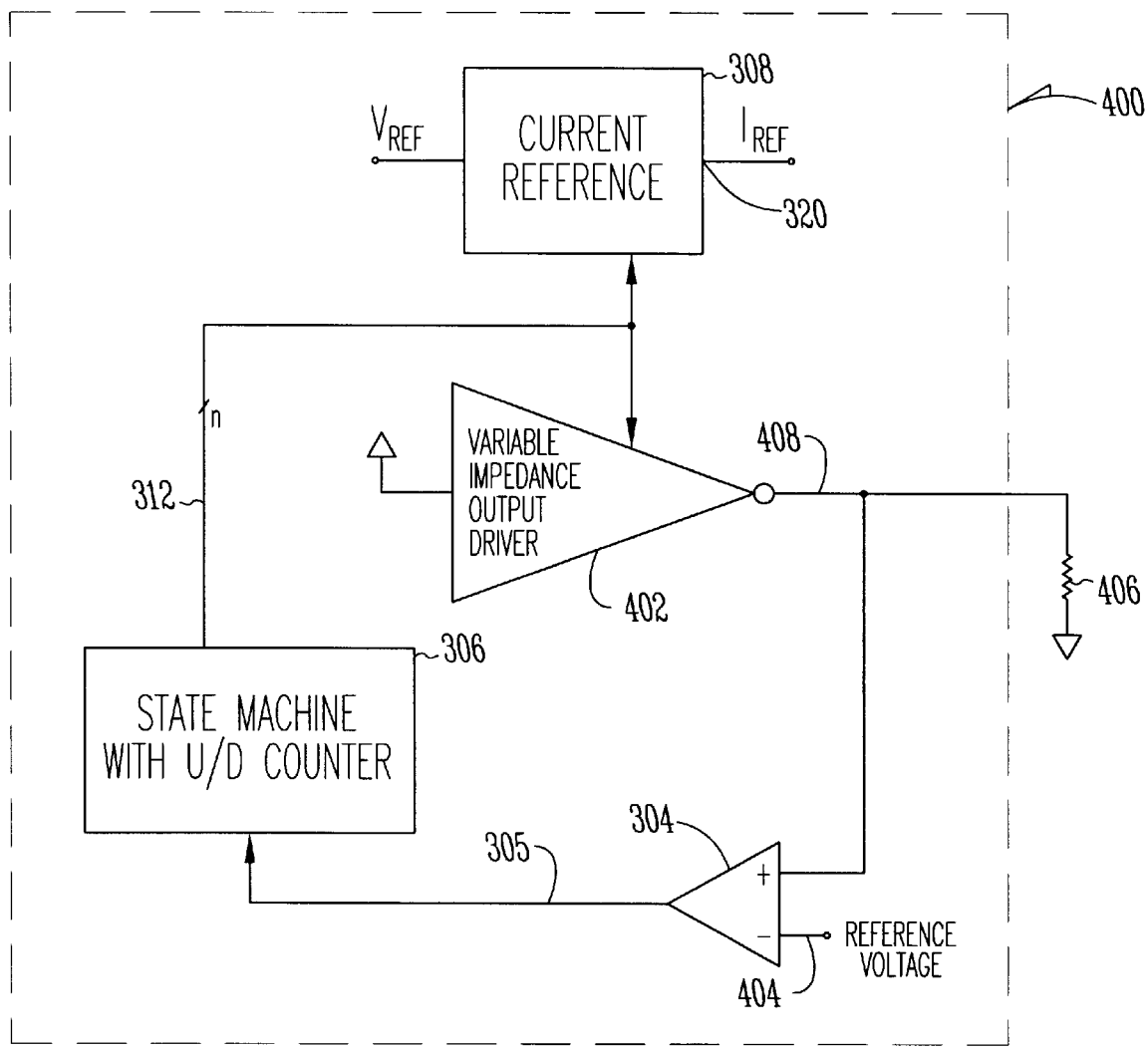
FIG. 4 shows an integrated circuit having a current reference and a variable impedance output driver sharing a common control loop circuit.

FIG. 4 shows an integrated circuit having a current reference and a variable impedance output driver sharing a common control loop circuit. Integrated circuit 400 includes current reference 308, voltage comparator 304, and state machine 306. Integrated circuit 400 also includes variable impedance output driver 402. In the embodiment of FIG. 4, the control loop circuit does not include current reference 308, but instead includes variable impedance output driver 402.

In operation, the output impedance of variable impedance output driver 402 is modified by control signals on node 312. The voltage on node 408 is a function of external resistor 406 and the output impedance of driver 402. Voltage comparator 304 compares the voltage on node 408 with the reference voltage on node 404 and generates a signal on node 305, which is input to state machine 306. When the output impedance of driver 402 is at a proper value, the loop is locked, and signals on node 312 change more slowly, or not at all. Current reference 308 utilizes the control signals on node 312 to modify internal resistances, thereby providing a substantially constant output current on node 320.

An example control loop circuit that includes a variable impedance output driver, voltage comparator, and a state machine, is described in M. Haycock and R. Mooney, "A 2.5 Gb/s Bidirectional Signaling Technology," Hot Interconnect Symposium V, Aug. 21–23, 1997.

Integrated circuit 400 can be any integrated circuit capable of including a currrent reference such as current reference 100 (FIG. 1). Integrated circuit 400 can be a processor such as a microprocessor, a digital signal processor, a microcontroller, or the like. Integrated circuit 400 can also be an integrated circuit other than a processor such as an application-specific integrated circuit (ASIC), a communications device, a memory controller, or a memory such as a dynamic random access memory (DRAM).

Integrated circuit 400 utilizes a single external resistor in a control loop to set the values of multiple internal components. For example, current reference 308 includes internal variable resistors with resistance values set, and variable impedance output driver 402 has an impedance set. Any number of components internal to integrated circuit 400 can be modified by the control signals generated in the control loop circuit that uses the external resistor. In this manner, a single external resistor can be shared among many internal components.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A current reference comprising:
   a variable resistor to adjust a voltage drop when a generated current passes therethrough;
   a control transistor having a source terminal coupled to the variable resistor, and having a gate terminal;
   a voltage reference coupled to the gate terminal of the control transistor, wherein the voltage drop and the voltage reference influence the generated current;
   a current mirror coupled to the control transistor; and
   a control loop circuit coupled between the current mirror and the variable resistor, wherein the control loop circuit comprises a comparator responsive to an output node of the current mirror.

2. The current reference of claim 1, wherein the variable resistor comprises a plurality of variable resistance devices coupled in parallel, each of the plurality of variable resistance devices including a PFET responsive to the control loop circuit.

3. The current reference of claim 1, wherein the control loop circuit comprises a state machine responsive to the comparator to influence the variable resistor.

4. A current reference comprising:
   a control transistor;
   a variable resistor coupled between the control transistor and a power supply node, wherein the variable resistor comprises a plurality of resistive devices in parallel, each of the plurality of resistive devices having a control input node to enable the resistive device; and
   a control loop circuit to influence the variable resistor, wherein the control loop circuit comprises:
      a comparator to compare two voltages, the comparator having an output node; and
      a state machine coupled to the output node of the comparator, the state machine having output nodes coupled to the control input nodes of the plurality of resistive devices.

5. The current reference of claim 4 further comprising a voltage reference circuit coupled to a control input node of the control transistor.

6. A current reference comprising:
   a control transistor;
   a variable resistor coupled between the control transistor and a power supply node;
   a control loop circuit to influence the variable resistor; and
   a voltage reference circuit coupled to a control input node of the control transistor;
   wherein the control transistor comprises a PFET.

7. The current reference of claim 6 wherein the PFET is a long channel device.

8. The current reference of claim 6 further comprising a current mirror coupled between the control transistor and the control loop circuit.

9. An integrated circuit comprising:
- a first current reference having a first variable resistor, a first control transistor, and a first current mirror coupled in series between two power supply nodes, the first current mirror having an output node with substantially constant current;
- a second current reference having a second variable resistor, a second control transistor, and a second current mirror coupled in series between the two power supply nodes; and
- a control loop circuit having an input node coupled to an output node of the second current mirror, and having an output node to influence the first and second variable resistors.

10. The integrated circuit of claim 9 further comprising a voltage reference coupled to gates of the first and second control transistors.

11. The integrated circuit of claim 10 wherein the control loop circuit comprises a comparator responsive to the second current mirror and the voltage reference.

12. The integrated circuit of claim 11 wherein the control loop circuit further comprises a state machine to influence the first and second variable resistors responsive to the comparator.

13. The integrated circuit of claim 11 further comprising an output node coupled to the output node of the first current mirror to drive a resistor external to the integrated circuit, and an input node coupled to the comparator to sample an external voltage on the external resistor.

14. The integrated circuit of claim 10 wherein the first current mirror comprises two NFET devices.

15. The integrated circuit of claim 9 wherein the first variable resistor includes a first plurality of resistive devices in parallel, each of the first plurality of resistive devices including a PFET and an N-well resistor.

16. The integrated circuit of claim 15 wherein the second variable resistor includes a second plurality of resistive devices in parallel, each of the second plurality of resistive devices including a PFET and an N-well resistor.

17. The integrated circuit of claim 16 wherein the control loop circuit is coupled to a gate of the NFET in each of the second plurality of resistive devices.

18. The current reference of claim 17 wherein the first and second control transistors are PFET devices.

19. An integrated circuit comprising:
- a control transistor having a gate coupled to a reference voltage node;
- a variable resistor coupled between a power supply node and a source of the control transistor; and
- a control loop circuit to modify a resistance value of the variable resistor, the control loop comprising a variable impedance output driver.

20. The integrated circuit of claim 19, wherein the control loop circuit further comprises a comparator coupled to an output node of the variable impedance output driver and a state machine responsive to the comparator.

21. The integrated circuit of claim 20, wherein the variable resistor comprises a plurality of variable resistance devices coupled in parallel, each of the plurality of variable resistance devices including a PFET responsive to the state machine.

22. The integrated circuit of claim 19, further comprising an output node responsive to the variable impedance output driver to drive a resistor external to the integrated circuit, and an input node to sample an external voltage on the external resistor, and wherein the control loop circuit comprises:
- a voltage comparator to compare the external voltage and an internal voltage; and
- a state machine responsive to the voltage comparator to influence the variable resistor.

* * * * *